US011851236B2

(12) United States Patent
Kao et al.

(10) Patent No.: US 11,851,236 B2
(45) Date of Patent: Dec. 26, 2023

(54) PIPE CONNECTABLE PLASTIC BUCKET AND METHOD OF USING THE SAME

(71) Applicant: eChem Solutions Corp., Taoyuan (TW)

(72) Inventors: Chen Ya Kao, Taoyuan (TW); Tz Jin Yang, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 0 days.

(21) Appl. No.: 17/700,544

(22) Filed: Mar. 22, 2022

(65) Prior Publication Data

US 2022/0315278 A1 Oct. 6, 2022

(30) Foreign Application Priority Data

Mar. 31, 2021 (TW) .................................. 110111941

(51) Int. Cl.
 *B65D 8/02* (2006.01)
 *H01L 21/67* (2006.01)
 *F16L 37/56* (2006.01)

(52) U.S. Cl.
 CPC .............. *B65D 11/08* (2013.01); *F16L 37/56* (2013.01); *H01L 21/67017* (2013.01)

(58) Field of Classification Search
 CPC ........... B65D 11/08; F16L 37/56; B67D 7/06; Y10T 137/3121; Y10T 137/3115; Y10T 137/3127
 USPC ...................................... 137/207.5, 206, 209
 See application file for complete search history.

(56) References Cited

U.S. PATENT DOCUMENTS

| 653,884 | A | * | 7/1900 | Richard et al. | ......... F25D 23/12 137/207.5 |
| 2,074,414 | A | * | 3/1937 | Murphy | ............... B67D 1/0801 222/399 |
| 4,257,527 | A | | 3/1981 | Snyder et al. | |
| 4,494,775 | A | * | 1/1985 | Nash | ....................... F16L 37/56 285/310 |
| 6,799,605 | B1 | * | 10/2004 | Van Scyoc | .............. F16L 37/56 137/614.04 |

FOREIGN PATENT DOCUMENTS

| CN | 205839033 | U | 12/2016 |
| CN | 108975258 | A | 12/2018 |
| CN | 208791170 | U | 4/2019 |
| CN | 209652297 | U | 11/2019 |
| TW | 252463 | | 7/1995 |
| TW | 202041291 | A | 11/2020 |

* cited by examiner

*Primary Examiner* — Michael R Reid

(57) ABSTRACT

A pipe connectable plastic bucket includes a bucket and at least two quick-connect devices. The bucket has a plurality of through holes for communication between the inside and the outside of the bucket. The at least two quick-connect devices respectively correspond to the plurality of through holes, and are disposed on the bucket. The at least two quick-connect devices are adapted to connect to pipes, and are used for allowing a fluid entering and exiting the bucket through the plurality of the through holes. The at least two quick-connect devices comprise a first quick-connect device for allowing the liquid to enter and to exit the bucket. The present invention also provides a method of using the pipe connectable plastic bucket.

1 Claim, 5 Drawing Sheets

PIPE CONNECTABLE PLASTIC BUCKET AND METHOD OF USING THE SAME

FIELD OF THE INVENTION

The present invention relates to a container, and more particularly to a container for unloading and storing a liquid.

BACKGROUND OF THE INVENTION

In high-precision industries such as semiconductor industry, cleanliness of related chemicals in the process is highly required. Therefore, containers used for containing the chemicals are not only resistant to the chemicals, but should also keep the chemicals stable and clean. Among the conventional containers, steel buckets have the advantages of high strength and pressure resistance; however, the steel buckets are heavy and not resistant to acids and alkalis, so they are not adapted to the majority of chemicals and in addition, the cost thereof is higher. On the other hand, plastic buckets with acid and alkali resistance and chemical resistance are conventionally used; however, the plastic buckets still need to be opened frequently during use, which is not conducive to cleanliness control.

SUMMARY OF THE INVENTION

The present invention provides a pipe connectable plastic bucket which has characteristics of lightness and acid and alkali resistance.

The present invention provides a pipe connectable plastic bucket, which comprises a bucket and at least two quick-connect devices. The bucket has a plurality of through holes for communication between an inside and an outside of the bucket. The at least two quick-connect devices respectively correspond to the plurality of through holes, and are disposed on the bucket. The at least two quick-connect devices may be adapted to connect to pipes, and are used for allowing a fluid to enter and to exit the bucket through the plurality of through holes. The at least two quick-connect devices comprise a first quick-connect device for allowing a liquid to enter and to exit the bucket.

In an embodiment of the present invention, the above-mentioned bucket further comprises a body portion and a lid. The lid is located above and on the body portion and is provided with the plurality of through holes.

In an embodiment of the present invention, the above-mentioned bucket is further used to contain the liquid under a normal pressure. The plurality of through holes comprise a first through hole and a second through hole, the at least two quick-connect devices further comprise a second quick-connect device. The first quick-connect device is disposed at the first through hole and used for allowing the liquid to enter and to exit the bucket, and the second quick-connect device is disposed at the second through hole and used for allowing a gas to enter and to exit the bucket.

In an embodiment of the present invention, the above-mentioned second quick-connect device is further used for allowing the liquid to enter the bucket.

In an embodiment of the present invention, the above-mentioned pipe connectable plastic bucket further comprises a tube. The tube is disposed in the inside of the bucket and is communicated to the first through hole.

In an embodiment of the present invention, the above-mentioned plurality of through holes further comprise a third through hole, the at least two quick-connect devices further comprise a third quick-connect device. The third quick-connect device is disposed at the third through hole and used for allowing the liquid to enter the bucket.

In an embodiment of the present invention, the above-mentioned second quick-connect device further comprises a liquid-passing portion and a gas-passing portion. The liquid-passing portion and the gas-passing portion are respectively adapted to connect to the pipes, the liquid further enters the bucket through the liquid-passing portion of the second quick-connect device, and the gas further enters the bucket through the gas-passing portion.

In an embodiment of the present invention, the above-mentioned at least two quick-connect devices further respectively have at least one open state and at least one closed state, and are activated to the at least one open state by connecting to pipes.

In an embodiment of the present invention, the above-mentioned pipe connectable plastic bucket further comprises at least two adaptors. Each of the at least two adaptors is disposed between the respective through hole and the respective quick-connect device, and connects the respective quick-connect device to the bucket.

The present invention further provides a method of using the pipe connectable plastic bucket. The method includes a step of: connecting a first pipe to the first quick-connect device by a first end of the first pipe to open the first quick-connect device and to allow the liquid to exit the bucket through the first quick-connect device and the first pipe.

In an embodiment of the present invention, the above-mentioned method further comprises a step of: opening a second quick-connect device of the at least two quick-connect devices to allow a gas to enter and to exit the bucket through the second quick-connect device when the liquid is exiting the bucket.

In an embodiment of the present invention, the above-mentioned method further comprises a step of: connecting a second pipe to the second quick-connect device of the at least two quick-connect devices to open the second quick-connect device and to allow a gas to enter and to exit the bucket through the second quick-connect device and the second pipe.

In an embodiment of the present invention, the above-mentioned method further comprises a step of: connecting the first pipe to the second quick-connect device by a second end of the first pipe, and allowing the liquid to enter the bucket through the second quick-connect device after exiting the bucket, wherein the second end is opposite to the first end.

By using the quick-connect devices and having the plurality of through holes, the plastic bucket of the present invention has high airtightness, is able to keep the unloaded and stored liquid clean, and is able to modulate the pressure in the bucket to realize the unloading and storage of the liquid under the normal pressure.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

Figure 1A:
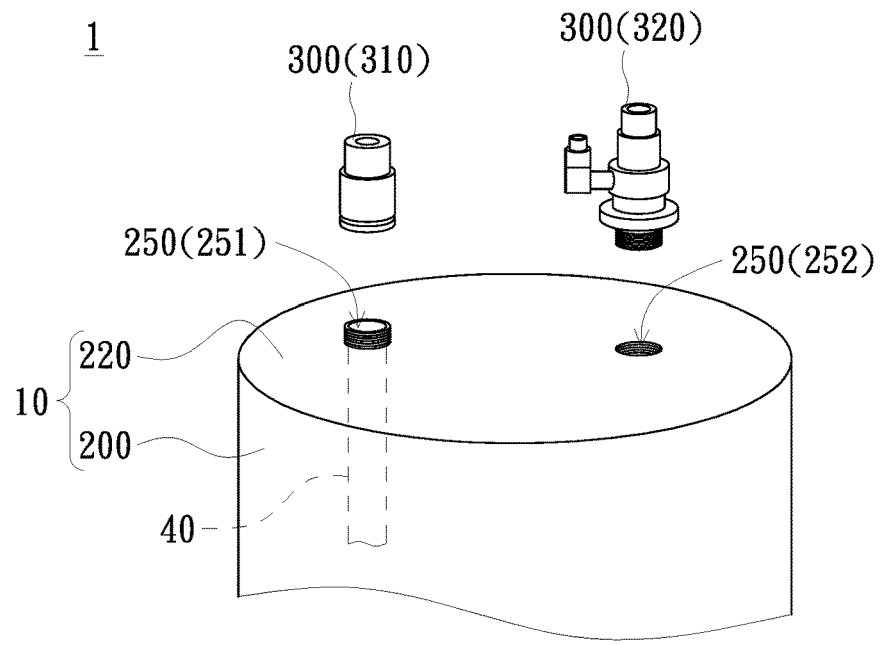
FIG. 1A is a schematic diagram of a pipe connectable plastic bucket according to an embodiment of the present invention.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The foregoing and other technical content, features, and effects of the present invention will now be described more specifically with reference to the preferred embodiments and the drawings. The directional terms mentioned in the following embodiments, for example: up, down, left, right, front or back, etc., are only directions for referring to the attached drawings. Therefore, the directional terms presented herein are for purposes of illustration and description only. It is not intended to limit the present disclosure.

Unless it is specifically defined in the present invention, the terms "to enter and to exit", "inflow", "outflow", "entry" and the like in the present disclosure only refer to movement. Directions of the movements, the entry, or the exit are not particularly limited.

Unless it is specifically defined in the present invention, the terms "liquid", "fluid", "gas" and the like in the present disclosure refers to various fluids, and are not limited to a particular liquid, gas or fluid.

The present invention provides a pipe connectable plastic bucket for unloading and storing a liquid. As the embodiment shown in FIGS. 1A to 1B, the pipe connectable plastic bucket 1 includes a bucket 10 and quick-connect devices 300. In some embodiments of this invention, the pipe connectable plastic bucket 1 may further include a tube 40. In some embodiments of this invention, the pipe connectable plastic bucket 1 may further include adapters 50. In some embodiments of this invention, the pipe connectable plastic bucket 1 may further include any appropriate components.

Bucket 10, Body Portion 200, and Lid 220

In the embodiments of this invention, the bucket 10 may include a body portion 200 and a lid 220. In some embodiments of this invention, the bucket 10 may further include a plurality of through holes 250. The lid 220 is relatively located above and on the body portion 200. In an embodiment of this invention, the bucket 10 may be integrally formed, and the body portion 200 and the lid 220 are inseparable. In another embodiment of this invention, the body portion 200 and the lid 220 may be separately formed and then assembled into the bucket 10. The space in the bucket 10 may be used to store the liquid. A material of the bucket 10 is, for example, polyethylene (PE), high-density polyethylene (HDPE), or polypropylene (PP).

Through Hole 250

Figure 1B:
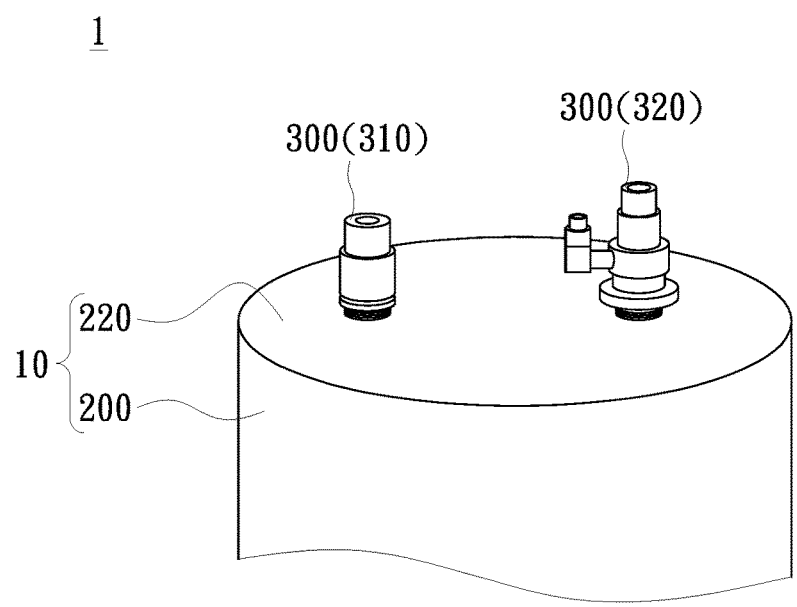
FIG. 1B is another schematic diagram of the embodiment shown in FIG. 1A.

In the embodiments of this invention, the bucket 10 has a plurality of through holes 250 for communication between the inside and the outside of the bucket 10. Therefore, even if the lid 220 can be opened with respect to the body portion 200, it is not necessary to open the lid 220 for operations of unloading and storing the liquid. In an embodiment of this invention, as shown in FIGS. 1A to 1B, the pipe connectable plastic bucket 1 has a first through hole 251 and a second through hole 252, and further includes at least two quick-connect devices 300 disposed on the bucket 10 and corresponding to and communicating with the plurality of through holes 250. The first through hole 251 and the second through hole 252 are preferably disposed on the lid 220.

Quick-Connect Device 300

In the embodiments of this invention, the quick-connect device 300 is not particularly limited. However, the quick-connect device 300 is able to quickly connect with a pipe and disconnect from the pipe. In at least one exemplary embodiment, the quick-connect device 300 is a snap-fit connector, a threaded quick-connect connector, or any other appropriate quick-connect device.

In the embodiments of this invention, the quick-connect device 300 is preferably detachably disposed on the bucket 10, and is adapted to connect to pipes and used for allowing a fluid (including but not limited to the liquid, the gas or a combination thereof) to enter and to exit the bucket 10 through the through hole 250. In this embodiment, the at least two quick-connect devices 300 include a first quick-connect device 310 and a second quick-connect device 320 respectively corresponding to the first through hole 251 and the second through hole 252.

Figure 2A:
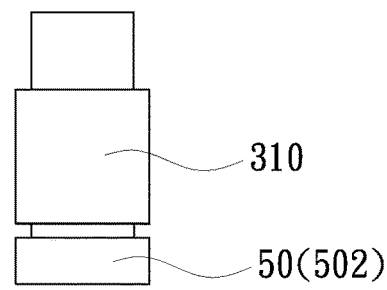
FIG. 2A is a schematic diagram of a quick-connect device according to an embodiment of the present invention.

The first quick-connect device 310 of the embodiments of this invention is used for allowing the liquid to enter and to exit the bucket 10, and is specifically shown in FIG. 2A. The first quick-connect device 310 is detachably disposed on the bucket 10. For example, one end of the first quick-connect device 310 and the bucket 10 may be tightly connected by the match of screw thread and screw hole, and the other end of the first quick-connect device 310 may be for a suitable pipe to plug in.

Tube 40

In some embodiments of this invention, the pipe connectable plastic bucket 1 may further include a tube 40. The tube 40 may be disposed in the bucket 10. The tube 40 is adapted to extend into the liquid in the pipe connectable plastic bucket 1, and is used for allowing the liquid to flow out or into the bucket 10. In some embodiments of this invention, the tube 40 communicates with the first through hole 251.

Adapter 50

As specifically shown in FIG. 2A, the embodiments of this invention may further include an adapter 50. The adapter 50 is disposed between the through hole 250 (e.g., the first through hole 251) and the first quick-connect device 310, and connects the first quick-connect device to the bucket 10. The adapter 50 may also connect with the first quick-connect device 310 and the first through hole 251 by the match of screw thread and screw hole. A material of the adapter 50 is preferably stronger than that of the first quick-connect device 310, and can withstand more forces and prevent deformation thereof, and even is able to prevent deformation of the first quick-connect device 310 or the first through hole 251.

The First Embodiment

In an embodiment of this invention, as shown in FIGS. 1A to 3, the pipe connectable plastic bucket 1 includes the bucket 10, at least two quick-connect devices 300, the tube 40 and the adapter 50. The bucket 10 includes the body portion 200, the lid 220, and the plurality of through holes 250. The lid 220 is disposed on the body portion 200 and is provided with the plurality of through holes 250 used for communication of the inside and the outside of the bucket 10. The plurality of through holes 250 includes the first through hole 251 and the second through hole 252. The bucket 10 is further used for containing a liquid under the normal pressure.

The at least two quick-connect devices 300 respectively correspond to the plurality of through holes 250 and are disposed on the bucket 10 through the adapter 50. The at least two quick-connect devices 300 are adapted to connect to pipes for allowing the fluid to enter and to exit the bucket 10 through the through holes 250. More specifically, the at least two quick-connect devices 300 include the first quick-connect device 310 and the second quick-connect device 320. The first quick-connect device 310 is disposed at the first through hole 251 through a first adapter 502 and is used for allowing the liquid to enter and to exit the bucket 10. The second quick-connect device 320 is disposed at the second through hole 252 through a second adapter 504 and includes a liquid-passing portion 3201 and an gas-passing portion 3202. The second adapter 504 includes a main body 5041 and an adapter portion 5042. Both of the liquid-passing portion 3201 and the gas-passing portion 3202 are connected to the main body 5041. Neither the liquid-passing portion 3201 nor the gas-passing portion 3202 is limited to a specific structure. In this embodiment, the difference between the liquid-passing portion 3201 and the gas-passing portion 3202 may be related to a flow rate of the liquid and a flow rate of the gas. In addition, the liquid-passing portion 3201 and the air-passing portion 3202 can be respectively connected to pipes. Thus, when the liquid or the gas enters the bucket 10, the liquid flows sequentially through the pipe, the liquid-passing portion 3201 and the second adapter 504, and the gas flows sequentially through the pipe, the gas-passing portion 3202 and the second adapter 504. The at least two quick-connect devices 300 further respectively has at least one open state and at least one closed state, and are activated to the at least one open state by connecting to the pipes. The tube 40 is disposed in the bucket 10 and communicates with the first through hole 251.

The second quick-connect device 320 may be used for allowing the gas to enter and to exit the bucket 10. For example, the second through hole 252 can be used for exhausting when the liquid enters the bucket 10 through the first quick-connect device 310. On the other hand, the gas can enter the bucket 10 through the second through hole 252 by means of the second quick-connect device 320 when the liquid exits the bucket 10 through the first quick-connect device 310, thereby maintaining the pressure in the bucket 10 and preventing the deformation of the bucket 10.

Figure 2B:
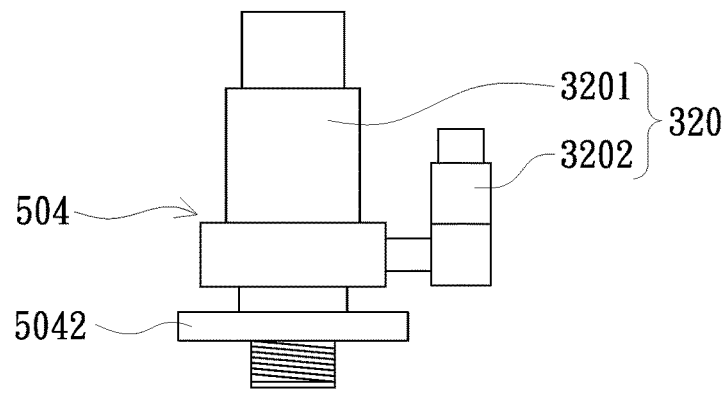
FIG. 2B is a schematic diagram of a quick-connect according to another embodiment of the present invention.
Figure 3:
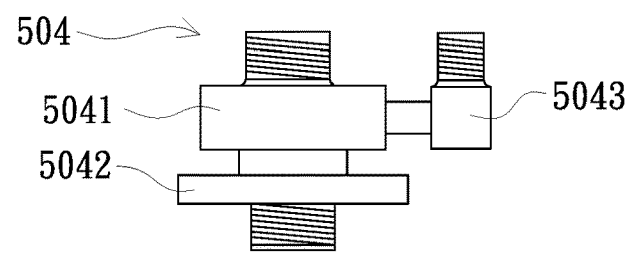
FIG. 3 is a partial schematic diagram of the embodiment shown in FIG. 2B.

The second quick-connect device 320 may also be detachably disposed on the bucket 10, and is further used for allowing the liquid to enter or to exit the bucket 10. As shown in FIG. 2B, the second quick-connect device 320 and the second adapter 504 may be connected by, for example, the match of screw thread and screw hole, and connection of the adapter portion 5042 of the second adapter 504 with the bucket 10 is also by the match of screw thread and screw hole. The second adapter 504 may further include a branch structure 5043, which is formed on one side of the main body 5041. The liquid-passing portion 3201 and the gas-passing portion 3202 can be respectively plugged in and connected with suitable pipes. Thus, the liquid enters the bucket 10 through the liquid-passing portion 3201 and the main body 5041, and the gas enters or exits the bucket 10 through the gas-passing portion 3202, the branch structure 5043 and the main body 5041.

The Second Embodiment

Figure 4:
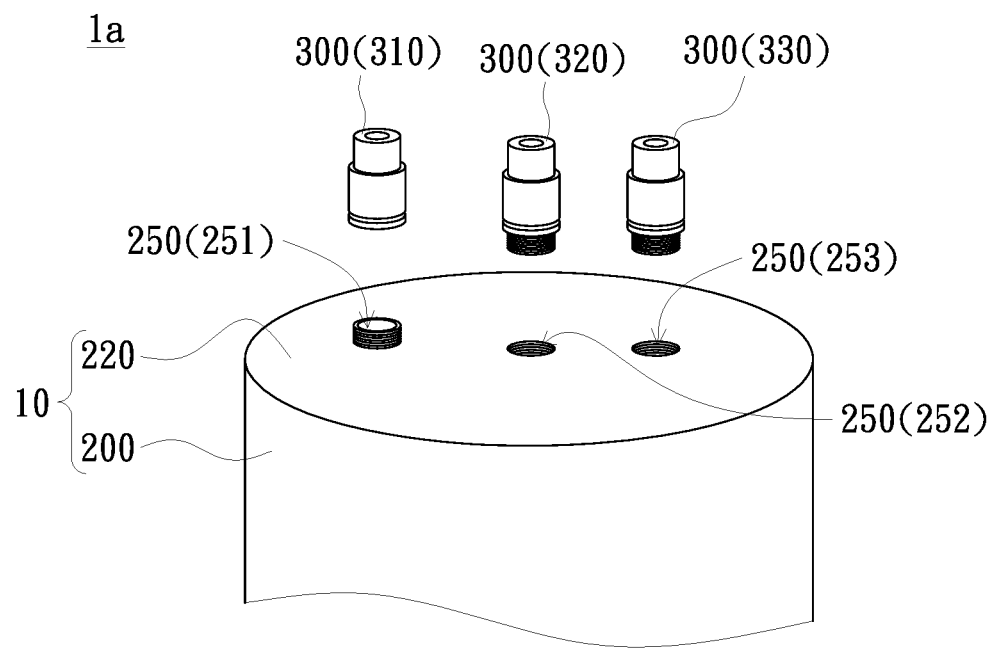
FIG. 4 is a schematic diagram of a pipe connectable plastic bucket according to another embodiment of the present invention.

FIG. 4 shows another embodiment of this invention. For simplicity of description, the same or similar parts with the previous embodiment will not be repeated here. A difference from the first embodiment is that a structure of the second quick-connect device in this embodiment is less complicated, and different quick-connect devices which are respectively connected with different adapters are respectively for different fluids' in and out. As shown in FIG. 4, the bucket 10 of the pipe connectable plastic bucket 1a further has a third through hole 253, and further includes a third quick-connect device 330 disposed at the bucket 10 and corresponding to and communicating with the third through hole 253. The first quick-connect device 310 is used for allowing the liquid to enter and to exit the bucket 10, the second quick-connect device 320 is used for allowing the gas to enter and to exit the bucket 10, and the third quick-connect device 330 is used for allowing the liquid to enter and to exit the bucket 10.

The above-mentioned quick-connect devices 300 preferably has the at least one open state and the at least one closed state, and the quick-connect devices 300 communicates with the outside and allow the fluid to enter or to exit the bucket 10 through the through holes 250 when it is in the open state. On the contrary, the quick-connect devices 300 in the closed state are able to block the communication between the inside and the outside of the bucket 10 and further prevent the environment in the bucket 10 from exposure. The open state may be activated by, for example, the connection between the pipe and the quick-connect device 300. On the contrary, detachment of the pipe will make the quick-connect device 300 in the closed state. The matching of the quick-connect devices 300 and the pipes and the accompanying open and closed state are conventional and the relevant technology is herein incorporated by reference, which will not be repeated here. In addition, the connection of the pipes is only one of the examples, the opening or closing of the quick-connect devices 300 may be also achieved by other means.

The following is examples of cooperation of the pipe connectable plastic bucket 1 and other equipments, and methods of using the same.

Example 1

Figure 5A:
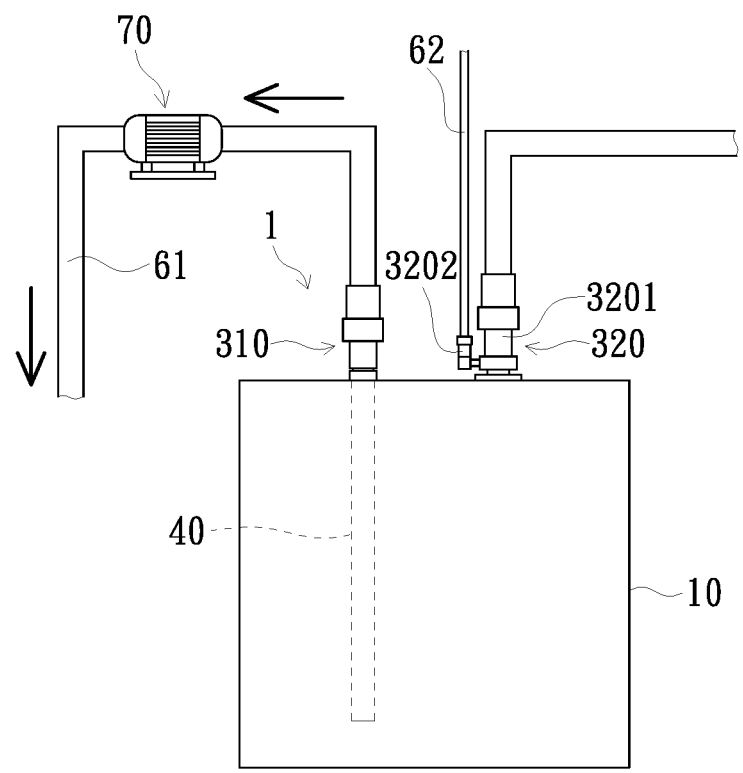
FIG. 5A is a schematic diagram of usage of the embodiment shown in FIGS. 1A-1B.

As shown in FIG. 5A, the first quick-connect device 310 is plugged in and connected with a suitable pipe (e.g., a first pipe 61), and is activated to the open state. The first pipe 61 may comprise two opposite ends (e.g., a first end and a second end). The first pipe 61 also leads to other units, such as a container that will receive the liquid discharged from the pipe connectable plastic bucket 1. The liquid-passing portion 3201 and the gas-passing portion 3202 of the second quick-connect device 320 may also be respectively activated to the open state by the connection with suitable pipes. In the example of FIG. 5A, the gas-passing portion 3202 of the second quick-connect device 320 is further connected to one end of a second pipe 62, and the other end of the second pipe 62 may be connected to a gas source. When the liquid exits the bucket 10, the gas source supplies gas to enter the bucket 10 through the second pipe 62, thereby maintaining the pressure in the bucket 10 and preventing deformation. The exiting liquid may flow to other units through the first pipe 61.

In addition, the pipe connectable plastic bucket 1 may further cooperate with a power device 70 (e.g., a pump) to extract the liquid in the pipe connectable plastic bucket 1. The gas which the gas source provides may be, for example, nitrogen.

Example 2

Figure 5B:
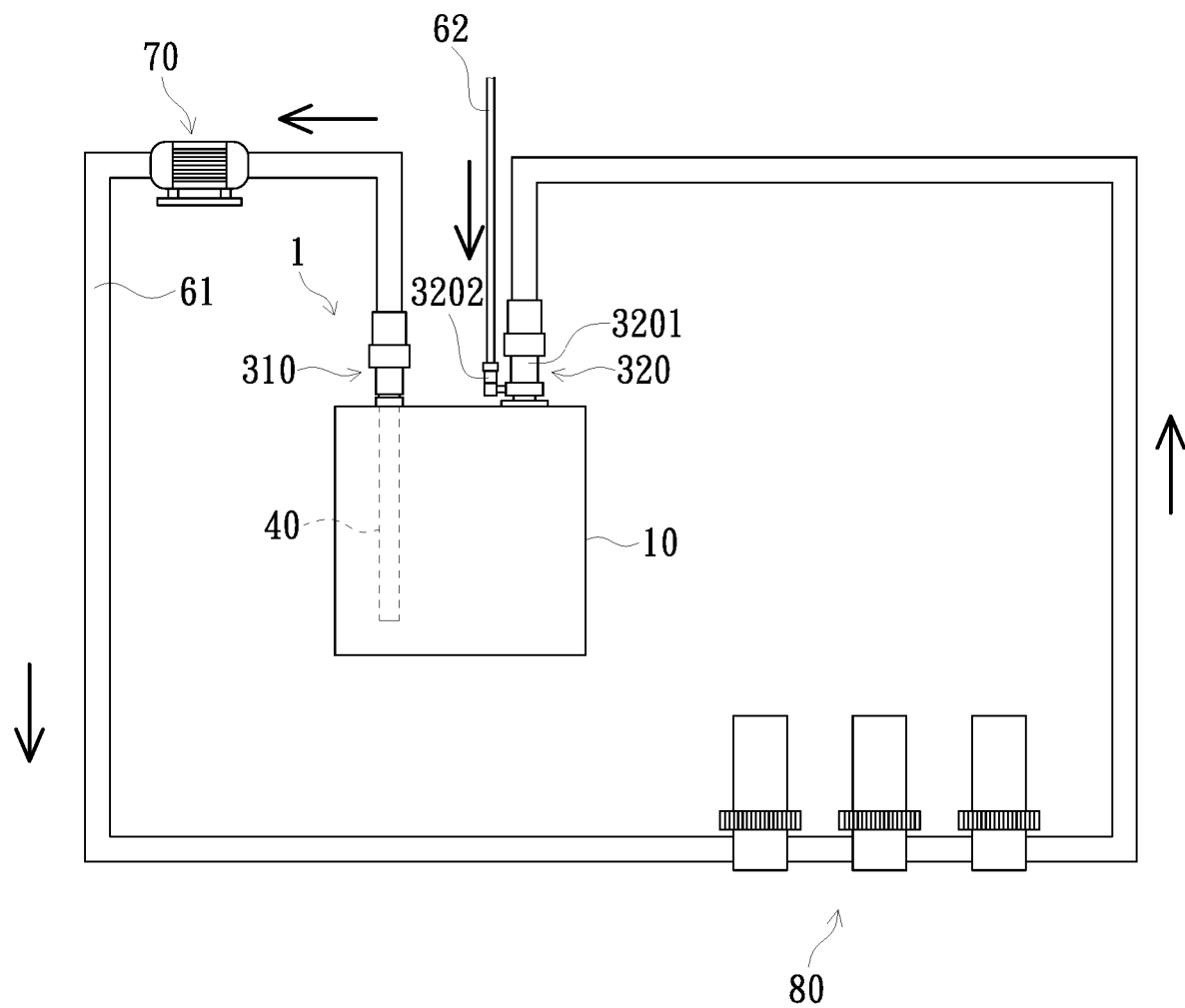
FIG. 5B is another schematic diagram of usage of the embodiment shown in FIGS. 1A-1B.

As shown in FIG. 5B, the first quick-connect device 310 is connected to the first end of the first pipe 61, and the first pipe 61 is further connected to the liquid-passing portion 3201 of the second quick-connect device 320 by the second end to form a closed path. In this way, the liquid drawn from the bucket 10 can flow back to the bucket 10 through the liquid-passing portion 3201 (the big arrow indicates the direction of the liquid flow). Example 2 also provides the following processes and effects:

(1) The liquid is allowed to flow back and agitated, and therefore is mixed thoroughly.

(2) With a filter device 80, the liquid exited the bucket 10 is filtered and then flowing back to the bucket 10, thereby realizing the cleaning of the liquid.

(3) When the liquid is water or a cleaning solution, the pipe connectable plastic bucket 1 may be cleaned by circulating the liquid, and therefore the pipe connectable plastic bucket 1 will be reusable.

(4) The gas-passing portion 3202 allows the gas to enter and exit the bucket 10 and therefore regulates the pressure in the bucket 10 and prevents deformation of the bucket 10 in the process of (1), (2), or (3). In addition, prevention of deformation of the bucket 10 can reduce undue disturbance to the liquid in the bucket 10.

In addition, the pipe connectable plastic bucket 1 may further cooperate with more pipes. For example, more pipes are used to connect the pipe connectable plastic bucket 1, the power device 70 and the filter device 80, and to form the closed path for the liquid's circulation.

In sum, the pipe connectable plastic bucket 1 and 1a of the embodiments of this invention have the characteristics of lightness and acid and alkali resistance. By means of the quick-connect devices 300 and the through holes 250, cleaning of the bucket 10 and unloading and storage of the liquid under the normal pressure are also realized, thereby achieving high airtightness. Accordingly, the present invention can prevent the environment in the bucket from exposure to the external environment and from the caused pollution, so that it is proper to unload and store objects with high specifications and high cleanliness requirements. For example, the chemicals stored and unloaded by the pipe connectable plastic buckets 1 and 1a of the embodiments of this invention can have a pH≤3, a metal concentration ≤10 ppt and a number of particles (particle size 40 nm) ≤10 pcs/ml, which meet the requirement of semiconductor level.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of using a pipe connectable plastic bucket, comprising steps of:
   connecting a first pipe to a first quick-connect device disposed on a bucket by a first end of the first pipe to open the first quick-connect device and to allow a liquid to exit the bucket through the first quick-connect device and the first pipe;
   connecting a second pipe to a second quick-connect device disposed on the bucket to open the second quick-connect device and to allow a gas to enter and to exit the bucket through the second quick-connect device and the second pipe; and
   connecting the first pipe to the second quick-connect device by a second end of the first pipe, and allowing the liquid to enter the bucket through the second quick-connect device after exiting the bucket, wherein the second end is opposite to the first end;
   wherein the bucket has a plurality of through holes, and the plurality of through holes are used for communication between an inside and an outside of the bucket; and
   the first quick-connect device and the second quick-connect device respectively correspond to the plurality of through holes.

\* \* \* \* \*